United States Patent
Tzivanopoulos et al.

(10) Patent No.: US 9,931,957 B2
(45) Date of Patent: Apr. 3, 2018

(54) BATTERY SYSTEM WITH A BATTERY, WHICH IS DESIGNED TO SUPPLY A HIGH-VOLTAGE NETWORK WITH ELECTRIC ENERGY, AND A MEASURING DEVICE FOR MEASURING AT LEAST ONE INSULATION RESISTANCE OF THE BATTERY

(71) Applicant: Robert Bosch GmbH, Stuttgart (DE)

(72) Inventors: Chrysanthos Tzivanopoulos, Remseck am Neckar (DE); Thomas Schaedlich, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/516,066

(22) PCT Filed: Aug. 13, 2015

(86) PCT No.: PCT/EP2015/068635
§ 371 (c)(1),
(2) Date: Mar. 31, 2017

(87) PCT Pub. No.: WO2016/050406
PCT Pub. Date: Apr. 7, 2016

(65) Prior Publication Data
US 2017/0297447 A1    Oct. 19, 2017

(30) Foreign Application Priority Data
Oct. 2, 2014   (DE) .................. 10 2014 220 017

(51) Int. Cl.
B60L 11/18     (2006.01)
G01R 27/02    (2006.01)
(Continued)

(52) U.S. Cl.
CPC ........ B60L 11/1851 (2013.01); G01R 27/025 (2013.01); G01R 27/16 (2013.01);
(Continued)

(58) Field of Classification Search
CPC ... B60L 11/1851; G01R 27/025; G01R 27/16; G01R 31/025; G01R 31/1227; G01R 31/3606; H01M 10/48
See application file for complete search history.

(56) References Cited

U.S. PATENT DOCUMENTS

2007/0285057 A1   12/2007 Yano
2012/0306264 A1   12/2012 Komma et al.
(Continued)

FOREIGN PATENT DOCUMENTS

CN          101603986       12/2009
DE         102010007452     8/2011
(Continued)

OTHER PUBLICATIONS

International Search Report for Application No. PCT/EP2015/068635 dated Oct. 12, 2015 (English Translation, 2 pages).

*Primary Examiner* — Nader Bolourchi
(74) *Attorney, Agent, or Firm* — Michael Best & Friedrich LLP (57) ABSTRACT

The invention relates to a battery system (100) with a battery (20), which is designed to supply a high voltage network (70) with electric energy, and a measuring device (130) for measuring at least one insulation resistance provided between the battery (20) and a housing of the battery (20). The measuring device (130) is equipped with two measuring paths (140, 150), each of which is paired with one of two high-voltage connections (21, 22) of the battery (20), each of which comprises a series circuit that comprises a first resistor (142, 152) and a relay (145, 155), and each of which (Continued)

is connected between the paired high-voltage connection (21, 22) and a point (25) that has a housing potential. Furthermore, each series circuit has a semiconductor switch (147, 157). The measuring device (130) also has two functional modes in which the relays (145, 155) of the measuring paths (140, 150) are closed. When switched to a passive functional mode of the two functional modes, the measuring device (130) is designed to open each semiconductor switch (147, 157) or to keep the semiconductor switch in an open state. When switched to an active functional mode of the two functional modes, the measuring device (130) is additionally designed to alternately open and close the semiconductor switches (147, 157), to measure a first voltage which drops over the first resistor (142, 152) of each measuring path (140, 150) when the semiconductor switch (147, 157) of the corresponding measuring path (140, 150) is closed, and to determine a corresponding insulation resistance of the battery (20) using each measured first voltage.

9 Claims, 3 Drawing Sheets

(51) Int. Cl.
*G01R 31/02* (2006.01)
*G01R 31/12* (2006.01)
*H01M 10/48* (2006.01)
*G01R 27/16* (2006.01)
*G01R 31/36* (2006.01)

(52) U.S. Cl.
CPC ....... *G01R 31/025* (2013.01); *G01R 31/1227* (2013.01); *G01R 31/3606* (2013.01); *H01M 10/48* (2013.01)

(56) References Cited

U.S. PATENT DOCUMENTS

| | | | |
|---|---|---|---|
| 2014/0084933 A1* | 3/2014 | Jang | G01R 31/3606 324/430 |
| 2014/0095093 A1 | 4/2014 | Hong et al. | |
| 2014/0159908 A1 | 6/2014 | Hong et al. | |

FOREIGN PATENT DOCUMENTS

| | | |
|---|---|---|
| EP | 1898227 | 3/2008 |
| EP | 2637028 | 9/2013 |
| EP | 2720056 | 4/2014 |
| WO | 2011095624 | 8/2011 |

* cited by examiner

BATTERY SYSTEM WITH A BATTERY, WHICH IS DESIGNED TO SUPPLY A HIGH-VOLTAGE NETWORK WITH ELECTRIC ENERGY, AND A MEASURING DEVICE FOR MEASURING AT LEAST ONE INSULATION RESISTANCE OF THE BATTERY

BACKGROUND OF THE INVENTION

The present invention relates to a battery system with a battery which is designed to supply a high-voltage network with electrical energy and a measuring device for measuring at least one insulation resistance of the battery, and a corresponding method for measuring at least one insulation resistance of a battery which is designed to supply a high-voltage network with electrical energy. The invention also relates to a vehicle having such a battery system.

Figure 1:
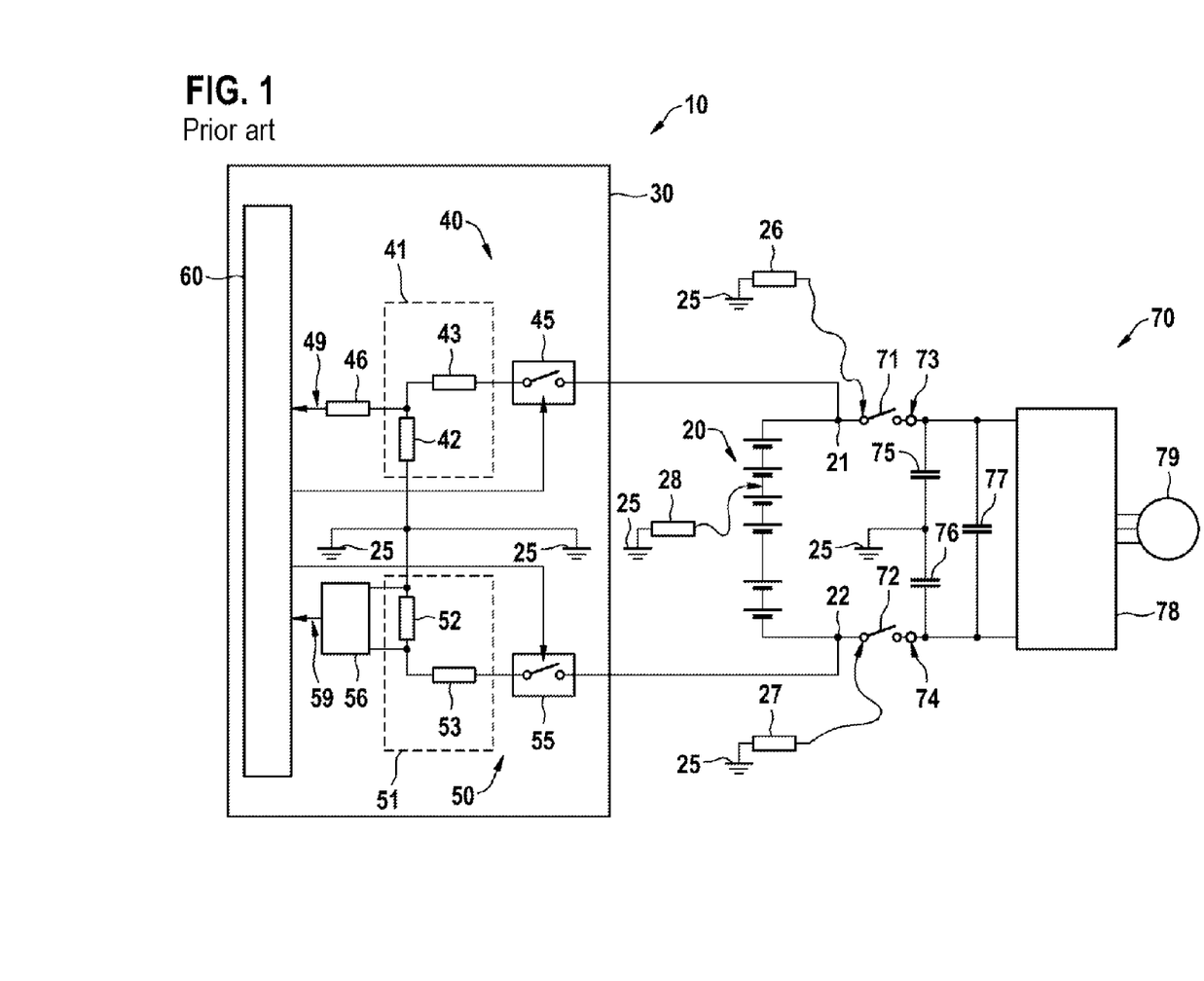
FIG. 1 shows a known battery system from the prior art.

FIG. 1 shows a battery system 10 known from the prior art, with a battery 20 configured as a high-voltage battery or traction battery, and a measuring device 30 for measuring at least one insulation resistance of the battery 20, which is present inside or outside the battery 20. The battery 20 comprises a plurality of series-connected battery cells. In the interests of simpler representation, said plurality of battery cells are not identified by reference numbers. Herein, a first insulation resistance 26 is the insulation resistance of the battery 20 which is present between a positive high-voltage terminal 21 of the battery 20 and a point 25 having a potential of a housing of the battery 20, hereinafter designated as the housing potential 25. Moreover, a second insulation resistance 27 is the insulation resistance of the battery 20 which is present between a negative high-voltage terminal 22 of the battery 20 and the housing potential 25. The positive high-voltage terminal 21 of the battery 20 is hereinafter designated as the first high-voltage terminal 21 of the battery 20. The negative high-voltage terminal 22 of the battery 20 is hereinafter designated as the second high-voltage terminal 21 of the battery 20. Moreover, a third insulation resistance 28 is the insulation resistance of the battery 20 which is present between a connection point, by means of which at least two battery cells in the battery 20 are interconnected, and the housing potential 25.

The measuring device 30, arranged in a battery control device (not represented) of the battery system 10, comprises a first measuring path 40 and a second measuring path 50, each of which comprises a high-resistance voltage divider 41, 51 and a relay 45, 55, and are connectable between an assigned high-voltage terminal 21, 22 of the two high-voltage terminals 21, 22 and the housing potential 25. Herein, the first high-voltage terminal 21 is assigned to the first measuring path 40. The second high-voltage terminal 22 is, moreover, assigned to the second measuring path 50. Each voltage divider 41, 51 is comprised of a first resistor 42, 52 and a second resistor 43, 53. Herein, each first resistor 42, 52 is connected to the housing potential 25, and each second resistor 43, 53 is connectable, via the corresponding relay 45, 55, to its assigned high-voltage terminal 21, 22. In the event of an insulation fault between the battery 20 and the housing, during the alternating closing of the relays 45, 55 on the measuring paths 40, 50, a measurable current flux flows through at least one of the voltage dividers 41, 51, such that a measurable voltage also drops across the first resistor 42, 52 of the at least one voltage divider 41, 51. Each voltage drop across the first resistor 42, 52 of each voltage divider 41, 51 is measured via a respective measuring input 49, 59 of an evaluation and control unit 60 of the measuring device 30 which is assigned to the corresponding measuring path 40, 50. The measuring input 49 which is assigned to the first measuring path 40 is connected, via a further resistor 46, to that terminal of the first resistor 42 on the voltage divider 41 of the first measuring path 40 which is not connected to the housing potential 25. For the measurement of the voltage drop across the first resistor 52 on the voltage divider 51 of the second measuring path 50, the measuring device 30 is equipped with an operational amplifier 56 which is connected, on the input side, to the first resistor 52 on the voltage divider 51 of the second measuring path 50 and, on the output side, to the measuring input 59 of the evaluation and control unit 60 assigned to the second measuring path 50. The evaluation and control unit 60 thus defines the respective voltage drops across the first resistors 42, 52 on the voltage dividers 41, 51. By the alternating switching-in of the measuring paths 40, 50, the voltage drop across each of the first resistors 42, 52 is determined and, in consideration of known system variables, the insulation resistances 26, 27, 28 of the battery 20 can be calculated in each case. The evaluation and control unit 60 is moreover designed to control the relays 45, 55, i.e. to open and close the latter.

The battery 20 represented in FIG. 1 is designed to a supply a high-voltage network 70 with electrical energy. To this end, the battery 20 is connectable to the high-voltage network 70 via two further relays 71, 72. Via the two further relays 71, 72, the first high-voltage terminal 21 of the battery 20 is directly connectable to a first high-voltage network terminal 73 on the high-voltage network 70, and the second high-voltage terminal 22 of the battery 20 is directly connectable to a second high-voltage network terminal 74 on the high-voltage network 70. Between the two high-voltage network terminals 73, 74 on the high-voltage network 70, a series-connected arrangement of two capacitors 75, 76 (Y-capacitors) is provided, connected in parallel with an intermediate circuit capacitor 77, which forms an intermediate circuit. A connection point, by means of which the two series-connected capacitors 75, 76 are connected, is connected to a housing potential 25. The high-voltage network 70 moreover comprises an inverter 78 and a motor 79. On its input side, the inverter 78 is connected in parallel with the intermediate circuit capacitor 77, and is designed to convert a DC voltage which can be delivered by the battery 20 into a three-phase AC voltage which is then delivered, on its output side, to the motor 79.

According to the prior art, dielectric withstand between a low-voltage network, which is galvanically separated from the high-voltage network 70, and the battery 20, or between the housing potential 25 and the battery 20, must be metrologically proven, both in-factory and during the conduct of all repairs on the battery 20. To this end, in the course of dielectric withstand testing (by a dielectric withstand test) using the battery control device (not represented) which is switched to a test mode, a test voltage is applied between the housing potential 25 and each high-voltage terminal 21, 22 of the battery 20 for a specified time. The test criterion to be used for this purpose is a measured current value. The test voltage here is delivered in the form of a DC voltage or an AC voltage.

In order to protect the electronic measuring systems of the measuring device 30 against damage during dielectric withstand testing, and to prevent any overshoot of a predefined limiting current value by the current value of any measuring current generated in course of insulation resistance measurement, the measuring paths 40, 50 must be configured with a correspondingly high resistance. As the predefined limiting current value cannot be selected to be infinitely small, each measuring path 40, 50, in a time during which dielectric withstand testing is in progress, and in a time during which no insulation resistance measurement is taking place, is galvanically separated from the battery 20, and thus also from the high-voltage network 70, wherein the relays (electromechanical switches) 44, 55 are opened.

According to the prior art, the measuring device 30, during each insulation resistance measurement, is connected via the relay 45 on the first measuring path 40 or via the relay 55 on the second measuring path 50 to the battery 20. During its service life, each relay 45, 55 undergoes from several tens of thousands up to a hundred thousand switching operations or switching cycles. The low measuring currents which arise during insulation resistance measurements, together with high switching voltages, which comprise voltage values of several hundred volts, are conducive to low-energy corona discharge during switching operations on these relays 45, 55. In combination with potential gas emissions from the relay housing material, this can lead to unwanted carbonization or film-formation on the switching contacts of the relays 45, 55. A current-related switching contact transition resistance can occur on the relays 45, 55, thereby invalidating the measurement.

From document CN 101603986 A, a high-voltage insulation resistance measuring circuit is known, comprising a high-voltage switching unit with a plurality of relays and a voltage measuring unit wherein, in a test mode, various components of the voltage measuring unit deliver a high-voltage signal via the closed relays.

SUMMARY OF THE INVENTION

According to the invention, a battery system is disclosed with a battery which is designed to supply a high-voltage network with electrical energy and a measuring device for measuring at least one insulation resistance which is present between the battery and a housing of the battery. In this case, the measuring device incorporates two measuring paths, each assigned to one high-voltage terminal of two high-voltage terminals of the battery, each comprising a series-connected arrangement of a first resistor and a relay, and each connected between the high-voltage terminal assigned thereto and a point at a housing potential. Each series-connected arrangement moreover comprises a semiconductor switch. The measuring device also has two functional modes, in which the relays on the measuring paths are closed. When switched to the passive functional mode of the two functional modes, the measuring device here is designed to open the respective semiconductor switch, or to maintain the latter in an open state. When switched to an active functional mode of the two functional modes, the measuring device is additionally designed to alternately open and close the semiconductor switches, to respectively measure a first voltage which drops across the first resistor of each measuring path when the semiconductor switch of the corresponding measuring path is closed, and to determine a corresponding insulation resistance of the battery using each measured first voltage.

According to the invention, a method is moreover disclosed for measuring at least one insulation resistance which is present between a battery which is designed to supply a high-voltage network with electrical energy and a housing of the battery, by means of a measuring device. In this case, the measuring device incorporates two measuring paths, each assigned to one high-voltage terminal of two high-voltage terminals of the battery, each comprising a series-connected arrangement of a first resistor and a relay, and each connected between the high-voltage terminal assigned thereto and a point at a housing potential. Each series-connected arrangement moreover comprises a semiconductor switch. The measuring device also has two functional modes, in which the relays are closed. The measuring device is switched from a passive functional mode of the two functional modes, in which the semiconductor switches are respectively opened or are maintained in an open state, to an active functional mode of the two functional modes, in which the semiconductor switches are alternately closed and opened, a first voltage which drops across the first resistor of each measuring path when the semiconductor switch of the corresponding measuring path is closed is respectively measured, and the corresponding insulation resistance is determined using each measured first voltage.

In the invention, the relays arranged in the measuring device according to the invention, in a state in which the measuring device is not supplied with electrical energy by the battery, i.e. a state in which no insulation measurement occurs, are closed. This means that, under normal conditions, the measuring device according to the invention is permanently galvanically connected to the battery or to a high-voltage network which is supplied by the battery. For the continued switchable execution of each measuring path or measuring channel in the measuring device, a cost-effective semiconductor switch is connected in each measuring path, in series with the corresponding relay.

Preferably, the respective semiconductor switches employed in the measuring paths only fulfil such technical requirements as are necessary for the conduction or blocking of the resulting measuring signals associated with the corresponding insulation resistance measurements. It is additionally preferred that the semiconductor switches are not designed in accordance with the technical requirements necessary for the execution of a dielectric withstand test, in which a test voltage in the high-voltage range is applied or is applicable between each of the high-voltage terminals of the battery and the housing.

In a preferred form of embodiment of the invention, the battery system according to the invention has a protective device for the protection of the measuring device. The protective device moreover comprises a control unit, which is designed to detect the presence of a test mode on a battery control device of the battery system, in which a test voltage is applied between at least one high-voltage terminal of the two high-voltage terminals and the housing and/or between at least one high-voltage network terminal of two high-voltage network terminals of the high-voltage network and the housing respectively, at least temporarily. Preferably, the test voltage is equal to a high voltage with a predefined characteristic. It is additionally preferred that the test voltage has a magnitude that rises continuously from a magnitude of 0 V up to a predefined magnitude, wherein the test voltage, immediately after the achievement of the predefined magnitude, is equal to a high voltage with a predefined characteristic. The control unit is moreover designed to open the relays upon the start of the test mode, and to close the relays at the end of the test mode.

Preferably, each high-voltage terminal, via a further relay which is assigned thereto, is directly connectable to a high-voltage network terminal of the two high-voltage network terminals which is assigned thereto.

The control unit is preferably a microcontroller arranged in the battery control device.

It is additionally preferred that the protective device comprises a voltage measuring unit which is designed to measure a second voltage which is present between each high-voltage terminal and the housing and/or between each high-voltage network terminal and the housing respectively and, in the event of a magnitude of each second voltage which is equal to a predefined limiting value, or which exceeds the latter, to transmit a control signal to the control unit. In this case, the control unit is designed, in the presence of each control signal, to detect the start of the test mode and to open the relays.

In the invention, the measuring device according to the invention, during each dielectric withstand test in which a critical test voltage is applied, is galvanically separated from the battery or from the high-voltage network which is to be supplied with electrical energy by the battery. To this end, galvanic separation of the measuring device according to the invention from the battery or from the aforementioned high-voltage network is executed immediately prior to the application of the critical test voltage. By this approach, the technical requirements which are to be fulfilled by the relays or electromagnetic switches which are incorporated in the measuring device in the course of their service life are significantly reduced. It is highly advantageous here that cyclical switching, to be executed under load, of the relays incorporated in the measuring device is omitted, and that the number of purely mechanical switching operations to be executed on these relays under dry load conditions is reduced to a minimum. Moreover, the risk of an occurrence of corona discharge, and of unwanted film formation on the switching contacts of said relays, is eliminated.

In another preferred form of embodiment of the invention, each semiconductor switch is arranged between the point which is at the housing potential and the relay on the corresponding measuring path and/or is designed for the switching of a voltage, the magnitude of which does not exceed a further predefined limiting value. Preferably, each first resistor is directly connected to the point which is at the housing potential. Preferably, each series-connected arrangement comprises a second resistor which, specifically, is directly connected to the high-voltage terminal which is assigned to the measuring path which incorporates the corresponding series-connected arrangement.

A further aspect of the invention relates to a vehicle having a battery system according to the invention.

BRIEF DESCRIPTION OF THE DRAWINGS

Exemplary embodiments of the invention are described in detail hereinafter, with reference to the accompanying drawings. Identical components are identified by the same reference symbols. In the drawings.

DETAILED DESCRIPTION

Figure 2:
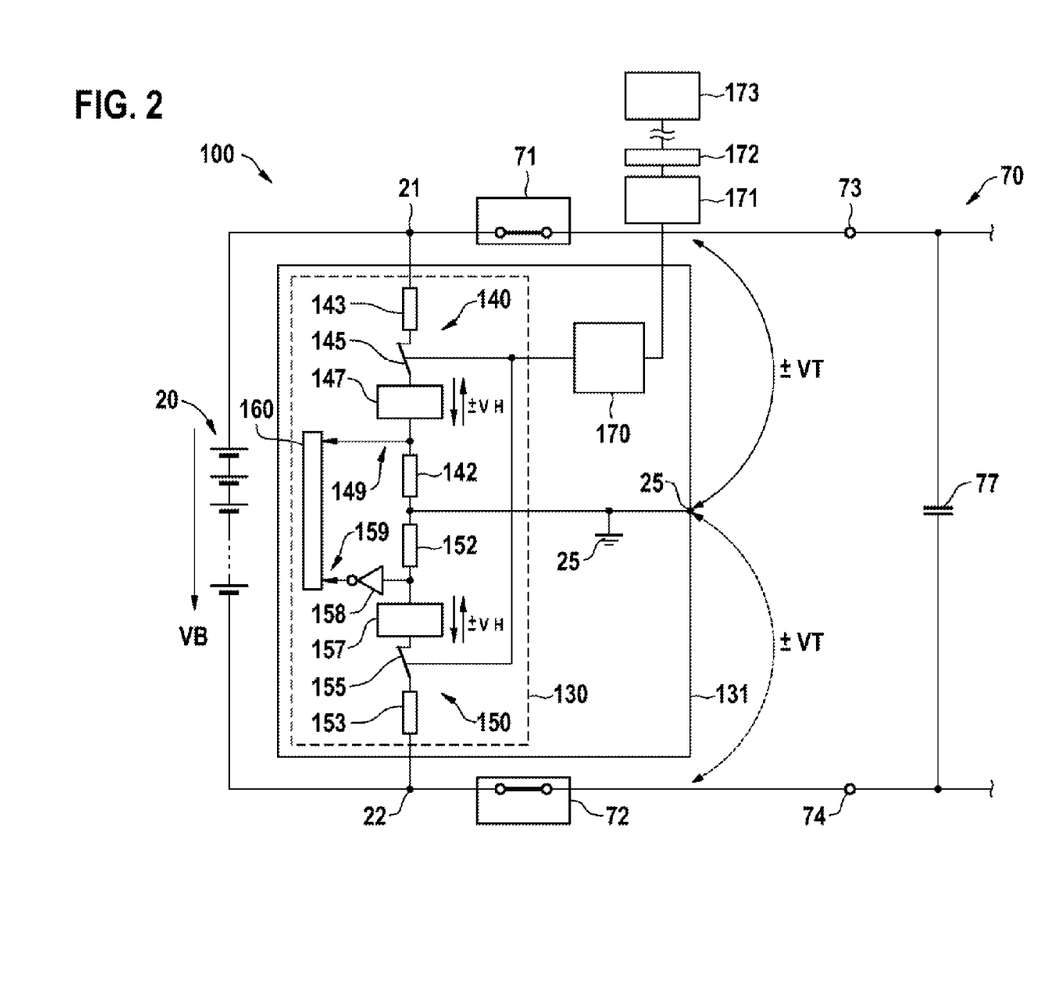
FIG. 2 shows a battery system according to a first form of embodiment of the invention.

FIG. 2 shows a battery system 100 according to a first form of embodiment of the invention. The battery system 100 comprises a battery 20 for the supply of a high-voltage network 70 with electrical energy. The battery 20 delivers a battery voltage VB. Additionally, the battery 20 is connectable via two further relays 71, 72 to the high-voltage network 70.

The battery system 100 represented in FIG. 2 is distinguished from the battery system 10 represented in FIG. 1 by the design of a measuring device 130 which is incorporated in the battery system 100 for the measurement of at least one insulation resistance (not represented) which is present between the battery 20 and a housing of the battery 20. The battery 20, the at least one insulation resistance and the two further relays 71, 72 of the battery system 100 according to the first form of embodiment, together with the associated high-voltage network 70, are each configured in an equivalent manner to the corresponding components represented in FIG. 1. In the interests of simpler representation, the at least one insulation resistance is not shown in FIG. 2, and the high-voltage network 70 is represented in a simplified manner, wherein a series-connected arrangement of two capacitors (Y-capacitors), which is present between two high-voltage network terminals 73, 74 of the high-voltage network 70, is not represented.

The measuring device 130 comprises a first measuring path 140 and a second measuring path 150, which are connected respectively between a point 25 having a potential of the housing of the battery 20, also designated here as the housing potential 25, and a high-voltage terminal 21, 22 of two high-voltage terminals 21, 22 of the battery 20 which is assigned thereto. Herein, a first high-voltage terminal 21 of the two high-voltage terminals 21, 22 of the battery 20 is assigned to the first measuring path 140. Additionally, a second high-voltage terminal 22 of the two high-voltage network terminals 21, 22 of the battery 20 is assigned to the second measuring path 150.

Each measuring path 140, 150 has a corresponding series-connected arrangement, respectively comprising a first resistor 142, 152, a second resistor 143, 153, a relay 145, 155 and a semiconductor switch 147, 157. Herein, the first resistor 142 on each measuring path 140, 150 is directly connected to the housing potential 25 and to the corresponding semiconductor switch 147, 157. Moreover, the second resistor 143, 153 on each measuring path 140, 150 is directly connected to the high-voltage terminal 21, 22 of the battery 20 which is assigned thereto, and to the relay 145, 155 on the corresponding measuring path 140, 150. Consequently, the semiconductor switch 147, 157 on each measuring path 140, 150 is arranged between the first resistor 142, 152 and the relay 145, 155 of the corresponding measuring path 140, 150.

The measuring device 130 has an active functional mode and a passive functional mode. During the active functional mode, the relays 145, 155 on the measuring paths 140, 150 remain closed, and the measuring paths 140, 150 are alternately switched by means of the semiconductor switches 147, 157. Each measuring path 140, 150 can be switched individually, wherein the semiconductor switch 147, 157 of the measuring path 140, 150 to be switched is closed, and the semiconductor switch 157, 147 of the other measuring path 150, 140 is opened, or is maintained in an open state. Each first voltage drop across the first resistor 142, 152 on each switched-in measuring path 140, 150 here is measured via a respective measuring input 149, 159, which is assigned to the corresponding measuring path 140, 150, of an evaluation unit 160, which is preferably arranged in the measuring device 130. By means of each measured first voltage, the evaluation unit 160 determines a corresponding insulation resistance (not represented) of the battery 20. For the measurement of the first voltage drop across the first resistor 152 on the second measuring path 150, the measuring device 130 is provided with an operational amplifier 158 which, on its input side, is connected to one terminal of the first resistor 152 on the second measuring path 150 which is not connected to the housing potential 25 and, on its output side, is connected to the measuring input 159 of the evaluation unit 160 which is assigned to the second measuring path 150. The semiconductor switches 147, 157 are designed respectively for the switching of a positive or negative voltage of a maximum voltage magnitude VH, i.e. for the switching of a voltage between −VH and +VH and, accordingly, only fulfil such technical requirements as are necessary for the conduction or blocking of measuring signals arising during corresponding insulation resistance measurements.

During the passive functional mode of the measuring device 130, in which no insulation resistance measurement occurs, the relays 145, 155 on the measuring paths 140, 150 continue to remain closed, and the measuring paths 140, 150 are electrically isolated from the battery 20 by means of the semiconductor switches 147, 157, in which the semiconductor switches 145, 157 are respectively opened or maintained in an open state.

In the first form of embodiment of the invention, the measuring device 130 is preferably located in a battery control device 131 of the battery system 100.

The battery system 100 moreover comprises a protective device for the protection of the measuring device 130, having a control unit 170 which, in the first form of embodiment of the invention, is a central microcontroller 170 of the battery control device 131, which can also comprise the evaluation unit 160. In this case, the electromechanical relays 145, 155 on the measuring paths 140, 150 are directly controlled by means of the central microcontroller 170.

If the battery control device 131 is in a test mode in which, for the execution of a dielectric withstand test, a positive or negative test voltage ±VT in the high-voltage range is applied between at least one high-voltage terminal 21, 22 of the two high-voltage terminals 21, 22 of the battery 20 and the housing potential 25, the relays 145, 155 on the measuring paths 140, 150 are opened by means of the microcontroller 170. The relays 145, 155 remain open over an entire test period. During the test mode or throughout the entire test period, the measuring device 130 to be protected is thus securely galvanically separated from the battery 20 or from the high-voltage network 70. The open contacts of the relays 145, 155 block the externally applied test voltage ±VT. The microcontroller 170 is moreover connected to a vehicle interface 171 which, via a bus system interface 172, is connected to a dielectric withstand test device 173 for the execution of dielectric withstand tests.

Figure 3:
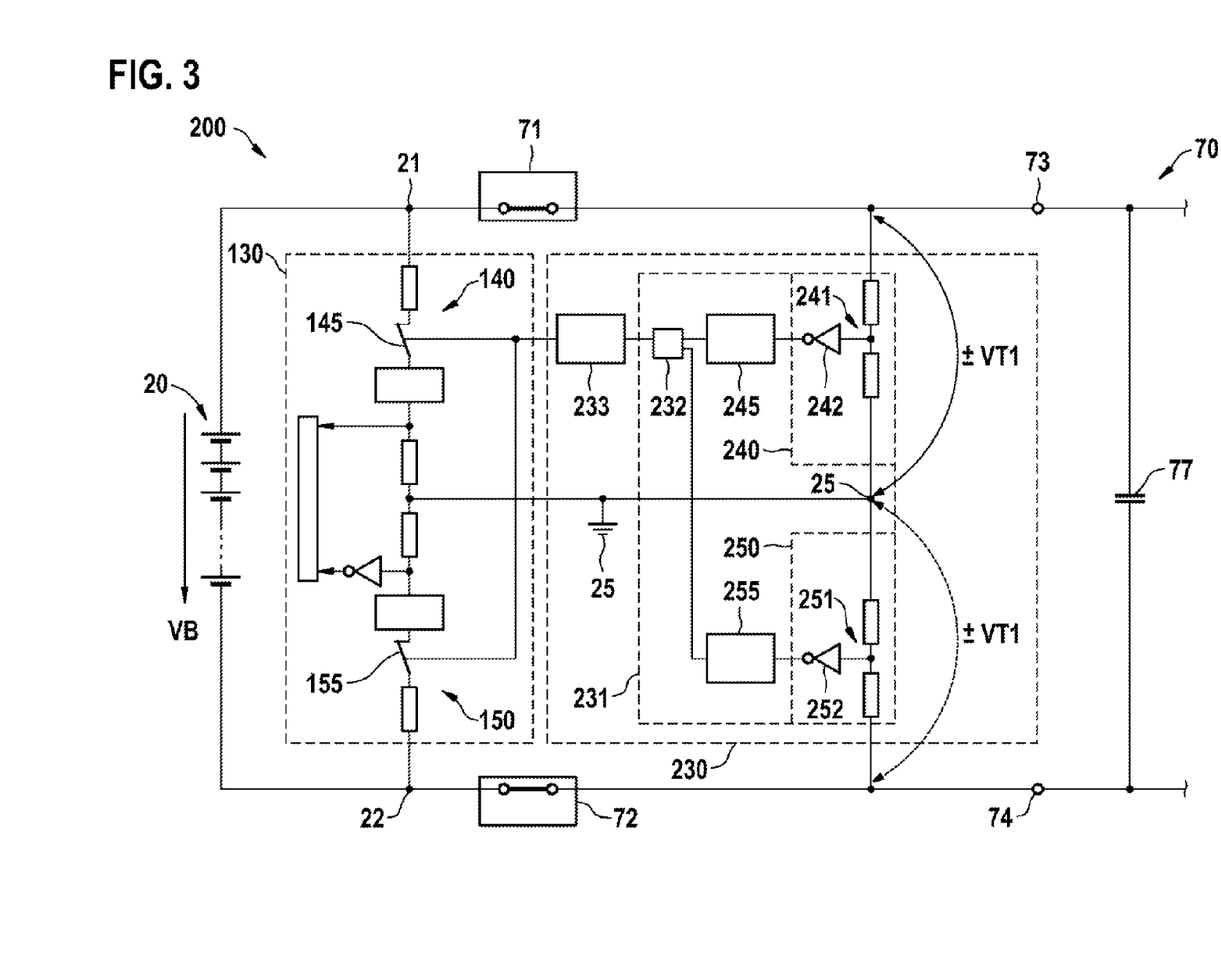
FIG. 3 shows a battery system according to a second form of embodiment of the invention.

FIG. 3 shows a battery system 200 according to a second form of embodiment of the invention. The battery system 200 comprises a battery 20 for the supply of a high-voltage network 70 with electrical energy. The battery 20 delivers a battery voltage VB. The battery 20 is connectable via two further relays 71, 72 to the high-voltage network 70. Via the two further relays 71, 72, a first high-voltage terminal 21 of the battery 20 is directly connectable to a first high-voltage network terminal 73 on the high-voltage network 70, and a second high-voltage terminal 22 of the battery 20 is directly connectable to a second high-voltage network terminal 74 on the high-voltage network 70. The battery system 200 moreover comprises a measuring device 130, which is designed for the measurement of at least one insulation resistance (not represented) which is present between the battery 20 and a housing of the battery 20. The battery 20, the at least one insulation resistance and the further relays 71, 72 of the battery system 200 according to the second form of embodiment of the invention, together with the associated high-voltage network 70, are each configured in an equivalent manner to the corresponding components represented in FIG. 1. Moreover, the measuring device 130 of the battery system 200 according to the second form of embodiment of the invention is configured in an equivalent manner to the measuring device 130 of the battery system 100 according to the first form of embodiment of the invention. In the interests of simpler representation, the at least one insulation resistance is not shown in FIG. 3, and the high-voltage network 70 is represented in a simplified manner, wherein a series-connected arrangement of two capacitors (Y-capacitors), which is present between the two high-voltage network terminals 73, 74 of the high-voltage network 70, is not represented. For the same reason, in the measuring device 130 represented in FIG. 3, only two measuring paths 140, 150 of the measuring device 130 and two relays 145, 155 on the two measuring paths 140, 150 are provided with reference numbers. Here again, a first measuring path 140 of the two measuring paths 140, 150 is assigned to the first high-voltage terminal 21 of the battery 20. Here again, moreover, a second measuring path 150 of the two measuring paths 140, 150 is assigned to the second high-voltage terminal 22 of the battery 20.

The battery system 200 moreover comprises a protective device for the protection of the measuring device 130 which, in the second form of embodiment of the invention, has a monitoring circuit 230 for the control of the two relays 145, 155 on the two measuring paths 140, 150 of the measuring device 130. As soon as at least one second voltage is applicable to the measuring device 130 via the further relays 71, 72, i.e. as soon as a second voltage is respectively applicable via the further relays 71, 72 between at least one high-voltage terminal 21, 22 of the two high-voltage terminals 21, 22 of the battery 20 and the housing potential 25, which second voltage lies outside a provided measuring range of the measuring device 130 and, consequently, has a magnitude which exceeds a maximum magnitude, the two relays 140, 150 on the measuring paths 140, 150 are automatically opened by the monitoring circuit 230. To this end, in the conduct of a dielectric withstand test, via the further relays 71, 72, a test voltage ±VT1, which is applicable between at least one high-voltage terminal 21, 22 of the two high-voltage terminals 21, 22 of the battery 20 and the housing potential 25 and defined by a ramp function, is varied until a desired high voltage is achieved, such that the measuring device 130, even in consideration of a respective time lag on the two relays 145, 155 of the two measuring paths 140, 150, can be promptly galvanically separated from the battery 20 or from the high-voltage network 70 by means of the monitoring circuit 230. To this end, the monitoring circuit 230 is configured for the detection of test voltages ±VT1, applicable in either direction of polarity, and for the comparison thereof with a predefined threshold value.

The monitoring circuit 230 comprises a voltage measuring unit 231. The voltage measuring unit 231 comprises a first voltage measurement input (not represented) and a first voltage measuring circuit 240 which is assigned thereto. Additionally, the voltage measuring unit 231 comprises a second voltage measurement input (not represented) and a second voltage measuring circuit 250 which is assigned thereto. The first measuring path 140 on the measuring device 130 and the first high-voltage network terminal 73 of the high-voltage network 70 are assigned to the first voltage measurement input and the first voltage measuring circuit 240. Additionally, the second measuring path 150 on the measuring device 130 and the second high-voltage network terminal 74 of the high-voltage network 70 are assigned to the second voltage measurement input and the second voltage measuring circuit 250.

By means of each voltage measuring circuit 240, 250, the second voltage applicable via the two further relays 71, 72 on the associated measuring path 140, 150, i.e. the second voltage between the associated high-voltage network terminal 73, 74 on the high-voltage network 70 and the housing potential 25, is detected. Each second voltage thus detected is compared with a predefined threshold value by means of a comparator 245, 255 on the voltage measuring unit 231 which is assigned to the corresponding voltage measuring circuit 240, 250. Each voltage measuring circuit 240, 250 comprises a resistive voltage divider 241, 251 with two resistors, which is connected between the high-voltage network terminal 73, 74 of the high-voltage network 70 which is assigned to the corresponding voltage measuring circuit 240, 250 and the housing potential 25, and an operational amplifier 242, 252. In the interests of simpler representation, the resistors of the two voltage dividers 241, 251 on the two voltage measuring circuits 240, 250 are not provided with reference numbers. The operational amplifier 242, 252 of each voltage measuring circuit 240, 250 is connected, on its input side, to a connection point by means of which the two resistors of the voltage divider 241, 251, arranged in the corresponding voltage measuring circuit 240, 250 and, on its output side, to the comparator 245, 255 which is assigned to the corresponding voltage measuring circuit 240, 250. Both comparators 245, 255 of the voltage measuring unit 231 are connected respectively, on the input side, to the operational amplifier 242, 252 arranged in the associated voltage measuring circuit 240, 250 and, on the output side, via an OR function 232 on the voltage measuring unit 231, to a control unit 233 on the monitoring circuit 230.

If one of the two comparators 245, 255 of the voltage measuring unit 231 detects the presence of the corresponding second voltage applicable to the measuring device 140 via the two further relays 71, 72 which lies outside the provided measuring range of the measuring device 130 and, consequently, has a magnitude which exceeds the maximum magnitude, the two relays 145, 155 on the measuring device 130 are opened by means of the control unit 233 and, in consequence, the measuring paths 140, 150 are securely separated from the battery 20 or from the high-voltage network 70. By means of an appropriate latch functionality, the relays 145, 155 remain open until such time as notification is delivered to a central microcontroller of a battery control device on the battery system 200 of the termination of the dielectric withstand test or the termination of a corresponding test mode on the battery control device such that, in consequence, no further test voltage ±VT1 is present between at least one high-voltage network terminal 73, 74 of the two high-voltage network terminals 73, 74 on the high-voltage network 70 and the housing potential 25.

In addition to the preceding written disclosure, for the further disclosure of the invention, reference shall hereby also be made to the representation in FIGS. 2 and 3.

The invention claimed is:

1. A battery system (100; 200) with a battery (20) which is designed to supply a high-voltage network (70) with electrical energy and a measuring device (130) for measuring at least one insulation resistance which is present between the battery (20) and a housing of the battery (20), wherein the measuring device (130) incorporates two measuring paths (140, 150), each assigned to one high-voltage terminal (21, 22) of two high-voltage terminals (21, 22) of the battery (20), each comprising a series-connected arrangement of a first resistor (142, 152) and a relay (145, 155), and each connected between the high-voltage terminal (21, 22) assigned thereto and a point (25) at a housing potential, characterized in that each series-connected arrangement moreover comprises a respective semiconductor switch (147, 157), and the measuring device (130) has two functional modes, in which relays (145, 155) on measuring paths (140, 150) are closed, wherein, when switched to a passive functional mode of the two functional modes, the measuring device (130) is designed to open the respective semiconductor switch (147, 157), or to maintain the latter in an open state and, when switched to an active functional mode of the two functional modes, the measuring device (130) is designed to alternately open and close semiconductor switches (147, 157), to respectively measure a first voltage which drops across the first resistor (142, 152) of each measuring path (140, 150) when the respective semiconductor switch (147, 157) of a corresponding measuring path (140, 150) is closed, and to determine a corresponding insulation resistance of the battery (20) using each measured first voltage.

2. The battery system (100, 200) as claimed in claim 1, having a protective device for the protection of the measuring device (130), wherein the protective device comprises a control unit (170; 233), which is designed to detect the presence of a test mode on a battery control device (131) of the battery system (100; 200), in which a test voltage (±VT), which is equal to a high voltage with a predefined characteristic, or in which a test voltage (±VT1), the magnitude of which rises continuously from a magnitude of 0 V up to a predefined magnitude and which, immediately after the achievement of the predefined magnitude, is equal to a high voltage with a predefined characteristic, is applied between at least one high-voltage terminal (21, 22) of the two high-voltage terminals (21, 22) and the housing and/or between at least one high-voltage network terminal (73, 74) of two high-voltage network terminals (73, 74) of the high-voltage network (70) and the housing respectively, at least temporarily, to open the relays (145, 155) upon the start of the test mode, and to close the relays (145, 155) at the end of the test mode.

3. The battery system (100; 200) as claimed in claim 2, wherein the control unit (170; 233) is a microcontroller arranged in the battery control device (131).

4. The battery system (200) as claimed in claim 2, wherein the protective device comprises a voltage measuring unit (231) which is designed to measure a second voltage which is present between each high-voltage terminal (21, 22) and the housing and/or between each high-voltage network terminal (73, 74) and the housing respectively and, in the event of a magnitude of each second voltage which is equal to a predefined limiting value, or which exceeds the latter, to transmit a control signal to the control unit (233), wherein the control unit (233) is designed, in the presence of each control signal, to detect the start of the test mode and to respectively open the relays (145, 155).

5. The battery system (100, 200) as claimed in claim 1, wherein each semiconductor switch (147, 157) is arranged between the point (25) which is at the housing potential and the relay (145, 155) on the corresponding measuring path (140, 150) and/or is designed for the switching of a further voltage, the magnitude of which does not exceed a further predefined limiting value (VH), and/or each first resistor (142, 152) is directly connected to the point (25) which is at the housing potential, and/or each series-connected arrangement comprises a second resistor (143, 153) which is directly connected to the high-voltage terminal (21, 22) which is assigned to a measuring path (140, 150) which incorporates a corresponding series-connected arrangement.

6. A method for measuring at least one insulation resistance which is present between a battery (20) which is designed to supply a high-voltage network (70) with electrical energy and a housing of the battery (20), by a measuring device (130) which incorporates two measuring paths (140, 150), each assigned to one high-voltage terminal (21, 22) of two high-voltage terminals (21, 22) of the battery (20), each comprising a series-connected arrangement of a first resistor (142, 152) and a relay (145, 155), and each connected between the high-voltage terminal (21, 22) assigned thereto and a point (25) at a housing potential, characterized in that each series-connected arrangement moreover comprises a semiconductor switch (147, 157) and the measuring device (130) has two functional modes, in which relays (145, 155) are closed, wherein the measuring device (130) is switched from a passive functional mode of the two functional modes, in which semiconductor switches (147, 157) are respectively opened or are maintained in an open state, to an active functional mode of the two functional modes, in which the semiconductor switches (147, 157) are alternately closed and opened, a first voltage which drops across the first resistor (142, 152) of each measuring path (140, 150) when the semiconductor switch (147, 157) of a corresponding measuring path (140, 150) is closed is respectively measured, and the corresponding insulation resistance is determined using each measured first voltage.

7. The method as claimed in claim 6, wherein the presence of a test mode on a battery control device (131) is detected, in which a test voltage (±VT), which is equal to a high voltage with a predefined characteristic, or in which a test voltage (±VT1), the magnitude of which rises continuously from a magnitude of 0 V up to a predefined magnitude and which, immediately after the achievement of the predefined magnitude, is equal to a high voltage with a predefined characteristic, is applied between at least one high-voltage terminal (21, 22) of the two high-voltage terminals (21, 22) and the housing and/or between at least one high-voltage network terminal (73, 74) of two high-voltage network terminals (73, 74) of the high-voltage network (70) and the housing, at least temporarily, the relays (145, 155) being opened upon the start of the test mode, and the relays (145, 155) being closed at the end of the test mode.

8. The method as claimed in claim 7, wherein a second voltage which is present between each high-voltage terminal (21, 22) and the housing and/or between each high-voltage network terminal (73, 74) and the housing respectively is measured and, in the event of a magnitude of each second voltage which is equal to a predefined limiting value, or which exceeds the latter, a control signal is generated, wherein, in the presence of each control signal, the start of the test mode is detected and the respective relays (145, 155) are opened.

9. A vehicle having a battery system (100; 200) as claimed in claim 1.

\* \* \* \* \*